(12) United States Patent
Pang et al.

(10) Patent No.: US 9,484,546 B2
(45) Date of Patent: Nov. 1, 2016

(54) OLED WITH COMPACT CONTACT DESIGN AND SELF-ALIGNED INSULATORS

(71) Applicant: UNIVERSAL DISPLAY CORPORATION, Ewing, NJ (US)

(72) Inventors: Huiqing Pang, Bellevue, WA (US); Emory Krall, Philadelphia, PA (US); Ruiqing Ma, Morristown, NJ (US)

(73) Assignee: UNIVERSAL DISPLAY CORPORATION, Ewing, NJ (US)

( * ) Notice: Subject to any disclaimer, the term of this patent is extended or adjusted under 35 U.S.C. 154(b) by 0 days.

(21) Appl. No.: 14/278,141

(22) Filed: May 15, 2014

(65) Prior Publication Data

US 2014/0339525 A1    Nov. 20, 2014

Related U.S. Application Data

(60) Provisional application No. 61/823,474, filed on May 15, 2013, provisional application No. 61/823,477, filed on May 15, 2013.

(51) Int. Cl.
*H01L 51/52*    (2006.01)

(52) U.S. Cl.
CPC .......... *H01L 51/52* (2013.01); *H01L 51/5209* (2013.01); *H01L 51/5225* (2013.01); *H01L 2251/5361* (2013.01)

(58) Field of Classification Search
CPC .............................. H01L 51/52; H01L 51/56
USPC .................... 257/40, 43, 57, 71, 72
See application file for complete search history.

(56) References Cited

U.S. PATENT DOCUMENTS

| 3,475,234 A | 10/1969 | Sarace et al. |
| 4,769,292 A | 9/1988 | Tang et al. |
| 5,247,190 A | 9/1993 | Friend et al. |
| 5,254,488 A | 10/1993 | Haller |
| 5,391,507 A | 2/1995 | Kwasnick et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,087,274 A | 7/2000 | Tonucci et al. |

(Continued)

FOREIGN PATENT DOCUMENTS

| WO | 2008057394 | 5/2008 |
| WO | 2010011390 | 1/2010 |
| WO | 2010038181 A1 | 4/2010 |

OTHER PUBLICATIONS

Baldo, et al., "Highly efficient phosphorescent emission from organic electroluminescent devices", Nature, vol. 395, pp. 151-154, 1998.

(Continued)

*Primary Examiner* — Chuong A Luu
*Assistant Examiner* — Rodolfo Fortich
(74) *Attorney, Agent, or Firm* — Morris & Kamlay LLP

(57) ABSTRACT

OLEDs and techniques for fabricating OLEDs are provided, in which the OLED has a shortest lateral current path through an active region that is longer than the shortest lateral electric field line within the active region. Such configurations prevent "hot spots" in the OLED panel, leading to a more uniform emission by the panel.

17 Claims, 15 Drawing Sheets

(56) References Cited

U.S. PATENT DOCUMENTS

| | | |
|---|---|---|
| 6,091,195 A | 7/2000 | Forrest et al. |
| 6,097,147 A | 8/2000 | Baldo et al. |
| 6,111,357 A * | 8/2000 | Fleming ............. H01L 27/3276 313/504 |
| 6,214,631 B1 | 4/2001 | Burrows et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,716,656 B2 | 4/2004 | Shtein et al. |
| 7,279,704 B2 | 10/2007 | Walters et al. |
| 7,431,968 B1 | 10/2008 | Shtein et al. |
| 7,968,146 B2 | 6/2011 | Wagner et al. |
| 2003/0230980 A1 | 12/2003 | Forrest et al. |
| 2004/0174116 A1 | 9/2004 | Lu et al. |
| 2007/0048886 A1 * | 3/2007 | Winters et al. ............. 438/29 |
| 2008/0182358 A1 * | 7/2008 | Cowdery-Corvan et al. ............. 438/104 |
| 2012/0286298 A1 | 11/2012 | Pang et al. |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

* cited by examiner

Cathode

Bus lines

Organic

Anode

Cutting pattern

Shortest current path within the device

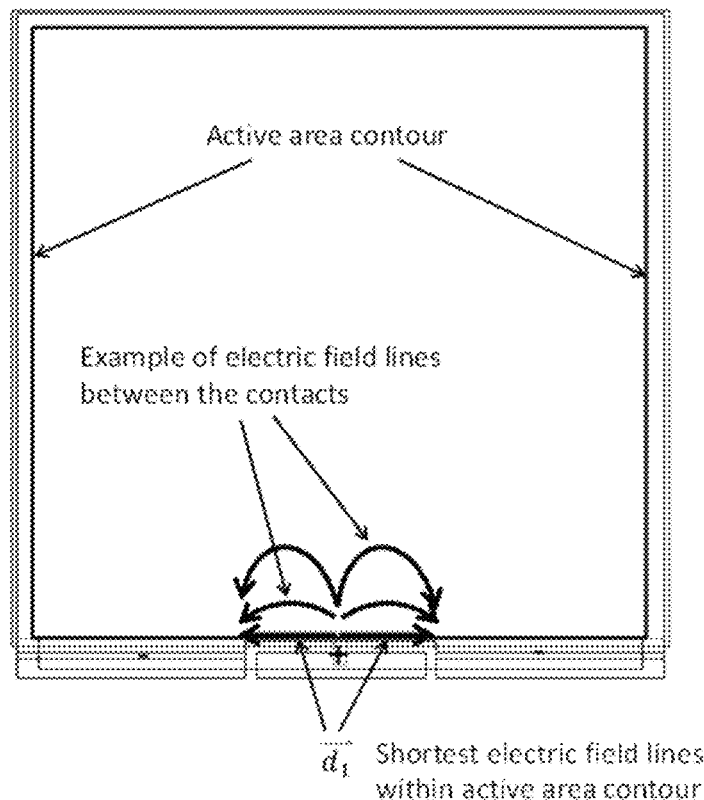
FIG. 15
FIG. 16
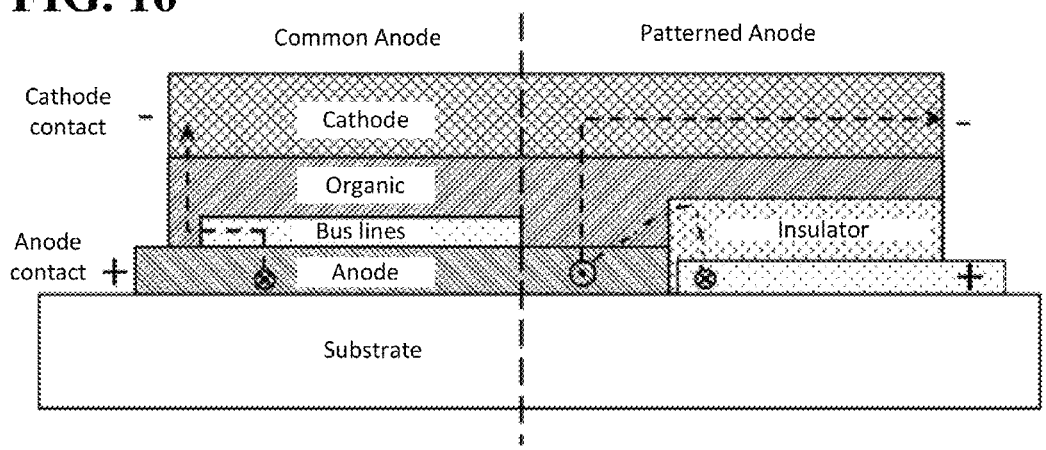

OLED WITH COMPACT CONTACT DESIGN AND SELF-ALIGNED INSULATORS

PRIORITY

This application claims priority to U.S. Provisional Application No. 61/823,474, filed May 15, 2013, and U.S. Provisional Application No. 61/823,477, filed May 15, 2013, the disclosure of each of which is incorporated by reference in its entirety.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs) and, more specifically, to OLEDs having improved uniformity of emission.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

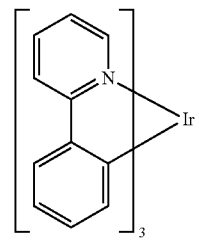

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

In an embodiment an OLED is provided that includes a substrate, a first electrical contact, a second electrical contact, an active region electrically connecting the first electrical contact and the second electrical contact, where the shortest lateral current path through the active region is longer than the shortest lateral electric field line within the active region. The shortest lateral current path may be 10% longer than, to twice as long as, the shortest lateral electric field within the active region. The shortest lateral current path through the active region also may be at least as long as a shortest edge of the active region. The first electrical contact may be an external contact of an anode of the organic light emitting device, and the second electrical contact may be an external contact of a cathode of the organic light emitting device.

In an embodiment, a bus line may be disposed within the active region and electrically connected to the first electrical contact. The bus line may extend into an internal region of the active region, and may include radial lines extending from a common point toward edges of the active region. The bus line may be a highly conductive metal, and/or may have a resistivity of not more than $10^{-6}$ Ωm.

In an embodiment, the substrate and/or the OLED may be flexible and/or transparent, and may include a plastic substrate and/or a glass substrate.

In an embodiment, the device may have a bezel of not more than 3 mm.

In an embodiment, the device may include a first electrode electrically connected to the first electrical contact, a second electrode electrically connected to the second electrical contact, an organic emissive layer disposed between the first electrode and the second electrode and in the active region, a conductive layer, and an insulating layer. The conductive layer and the insulator layer may be disposed between the first electrode and the organic emissive layer. Further, an insulator layer may be disposed adjacent to the bus line.

In an embodiment, a method of fabricating an organic light emitting device is provided. The method may include depositing a bus line over the substrate using a first shadow mask, and depositing an insulator layer over the substrate and adjacent to the bus line using the first shadow mask. A first electrode may be deposited over the substrate and electrically connected to a first electrical contact, and a second electrode electrically connected to a second electrical contact may be disposed over the substrate. An active region that includes organic light emitting material may be disposed over the substrate and between the first electrode and the second electrode, where the shortest lateral current path through the active region is longer than the shortest lateral electric field within the active region.

BRIEF DESCRIPTION OF THE DRAWINGS

FIG. 15 shows an illustration of a shortest electric field line in the OLED panel design shown in FIG. 13.

FIG. 16 shows a comparative cross-section of a conventional OLED panel and an OLED panel design according to an embodiment as disclosed herein.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
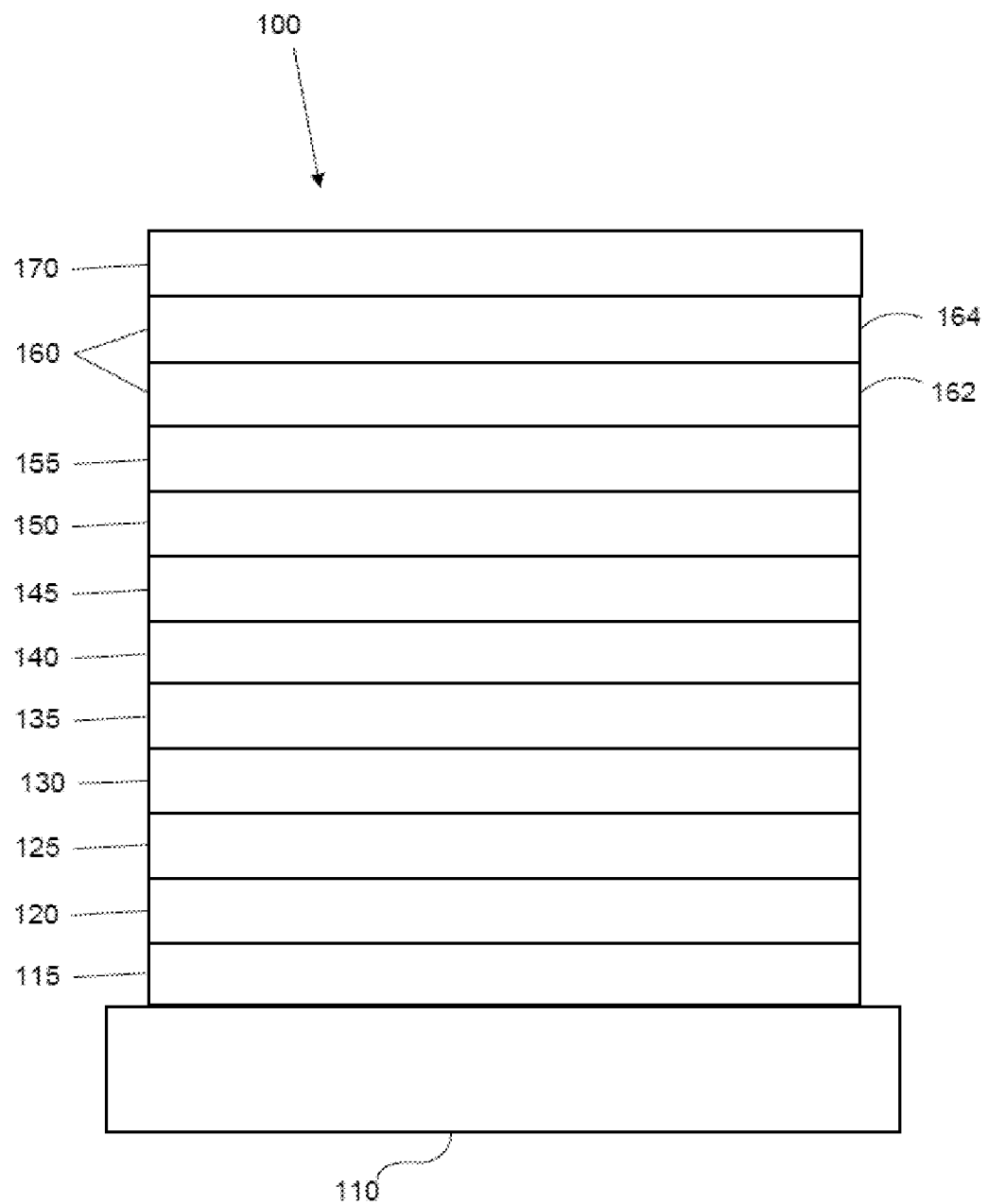
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
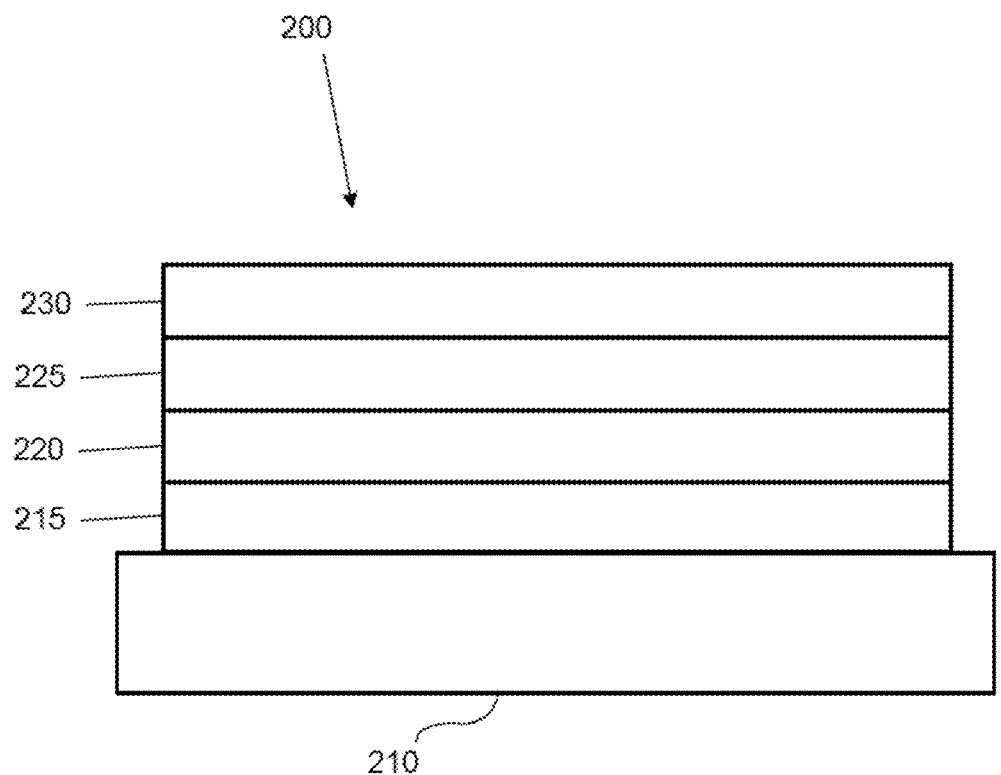
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Figure 3:
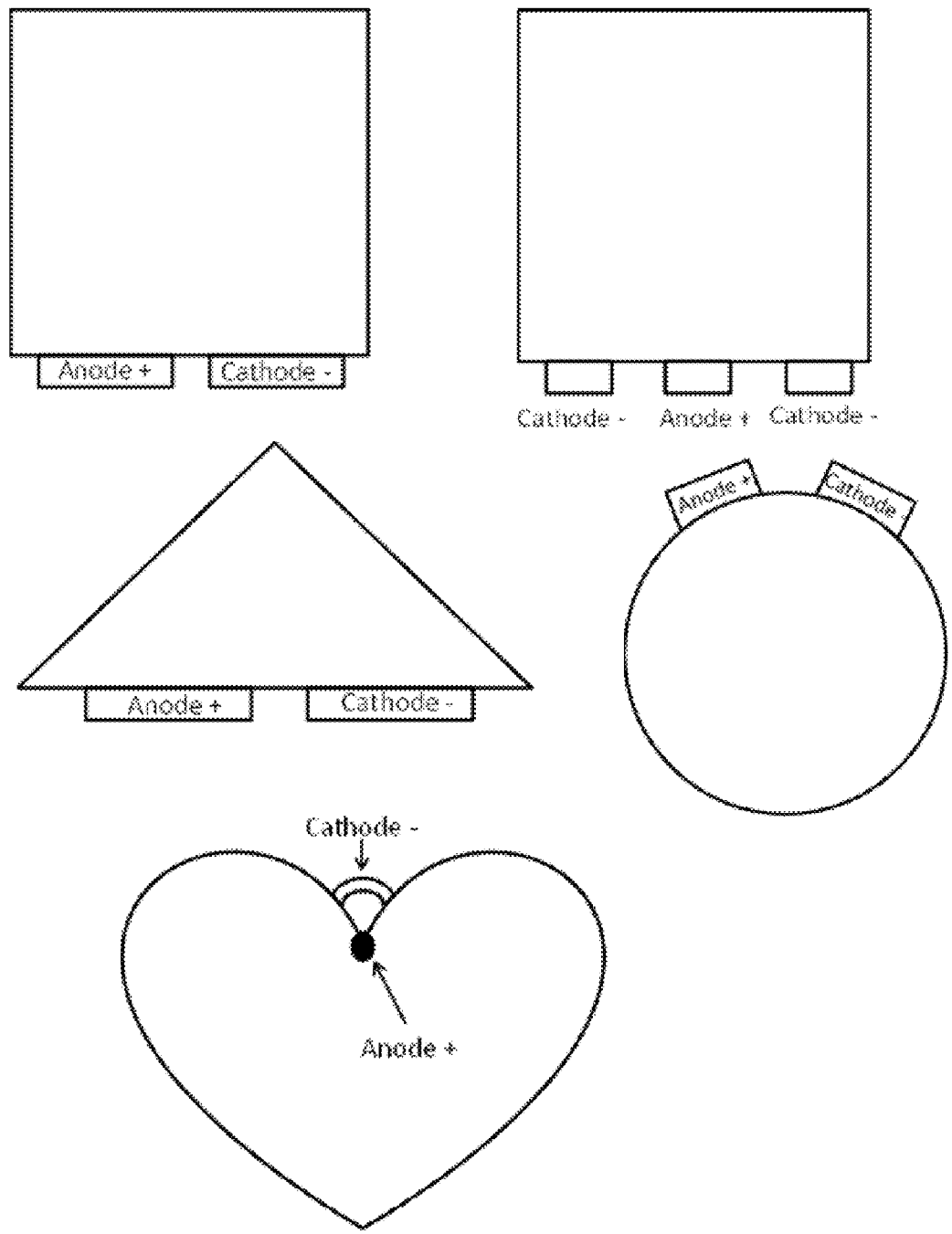
FIG. 3 shows examples of compact contact design as disclosed herein.
Figure 4:
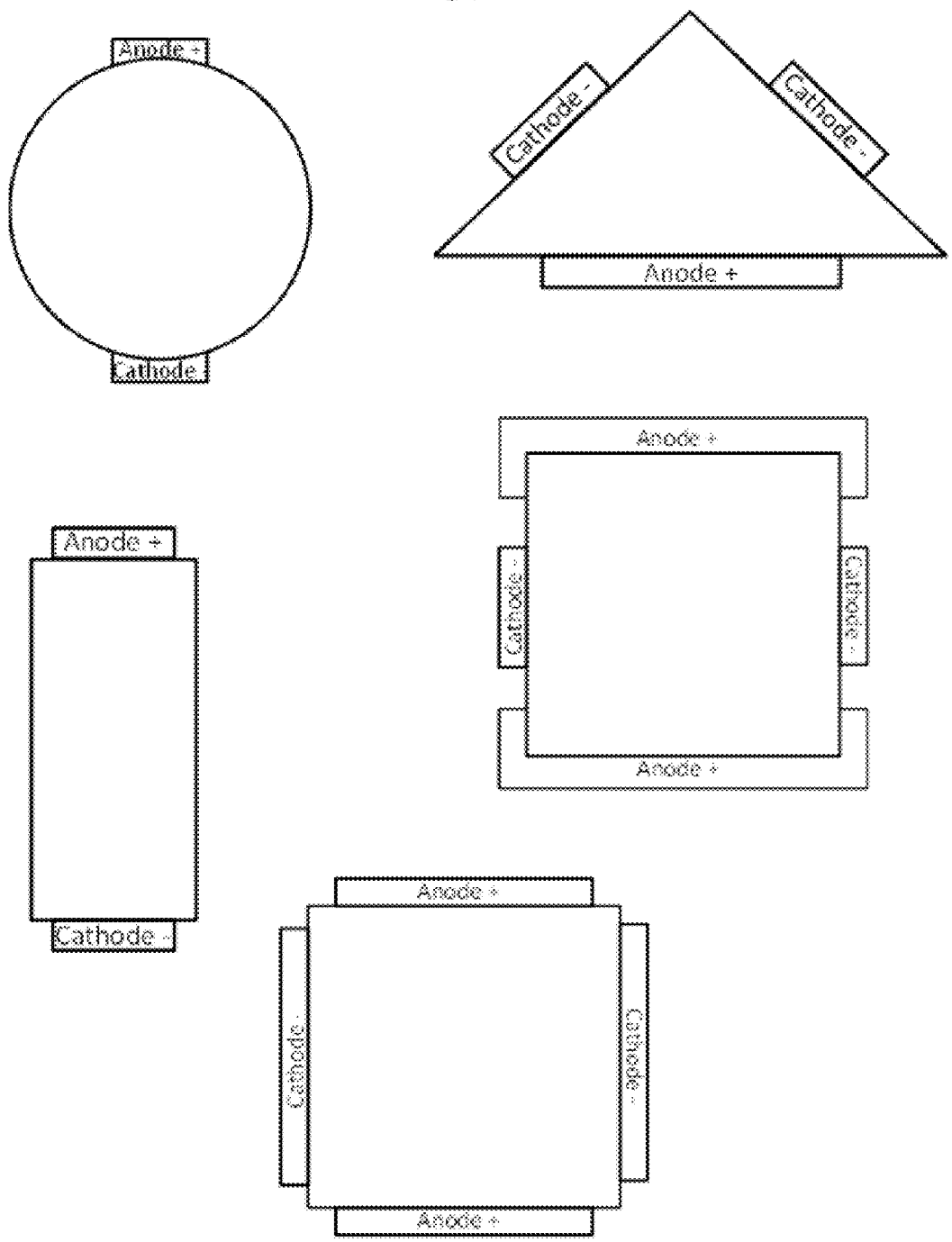
FIG. 4 shows examples of non-compact contact design as disclosed herein.

A common design rule for OLED panels, especially large-area OLED panels, typically is that electrode contacts should be placed as far apart on the device as possible. Such designs are described, for example, in U.S. Patent Application Pub. No. 2012/0286298, the disclosure of which is incorporated by reference in its entirety. However, there are applications in which it may be desirable for an OLED panel to have relatively compact contact design, thus requiring the contacts to be placed more closely than would otherwise be selected. As used herein, a compact contact design refers to the position of a pair of contacts of opposite polarities being relatively closely arranged, such as next to each other, or on the same side of the panel. Illustrative, non-limiting examples of compact contact design for regular and irregular shaped substrates are shown in FIG. 3. In general, the distance between the pair of contacts may be relatively small compared to the dimension of the panel. In contrast, some illustrative examples of non-compact contact design are shown in FIG. 4, where the contacts or portions of the contacts are placed relatively far from each other in contrast to the panel size.

Figure 5:
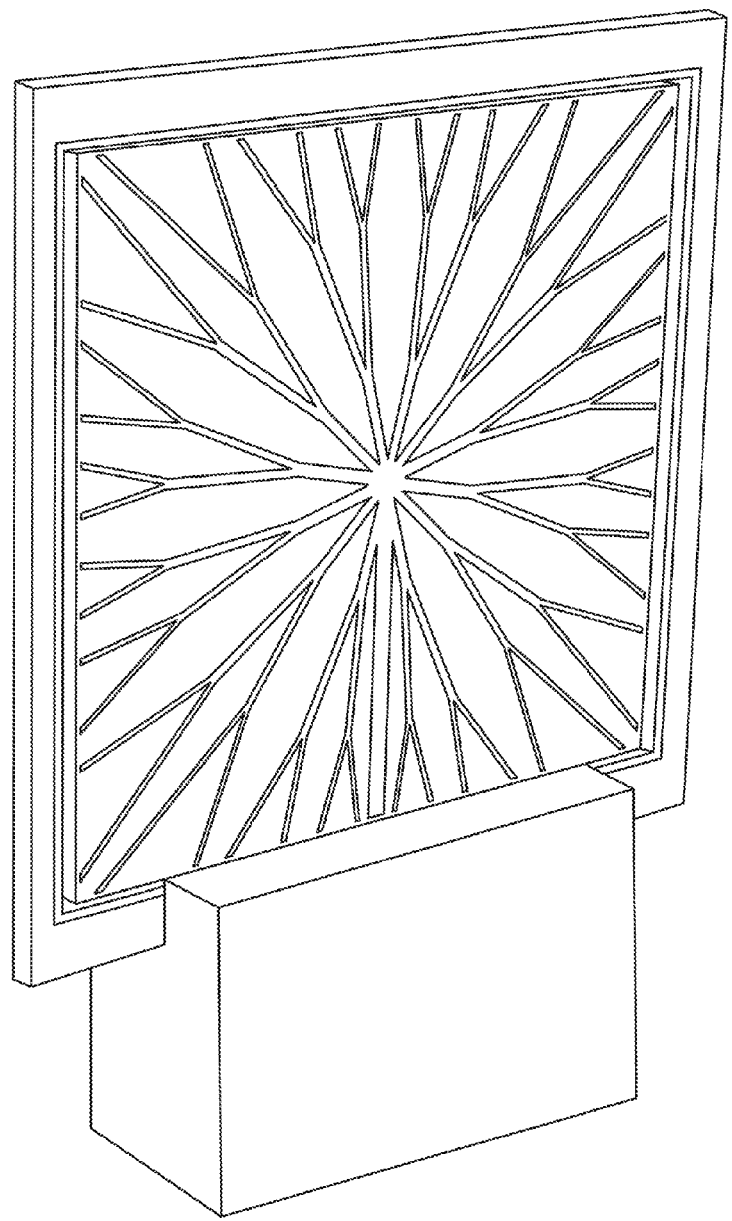
FIG. 5 shows a photograph of a single contact OLED panel with non-uniform emission.
Figure 6:
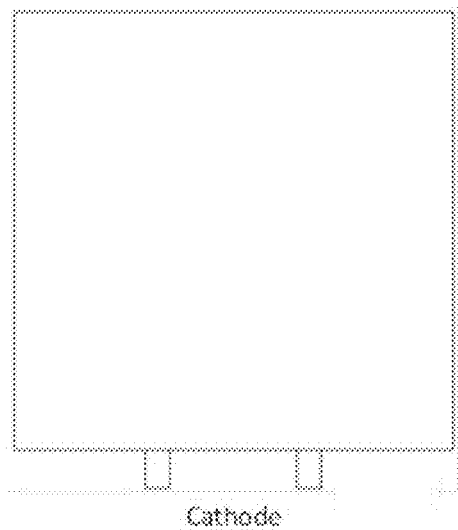
FIG. 6 shows example mask layouts for a conventional OLED panel with common anode layout.
Figure 6:
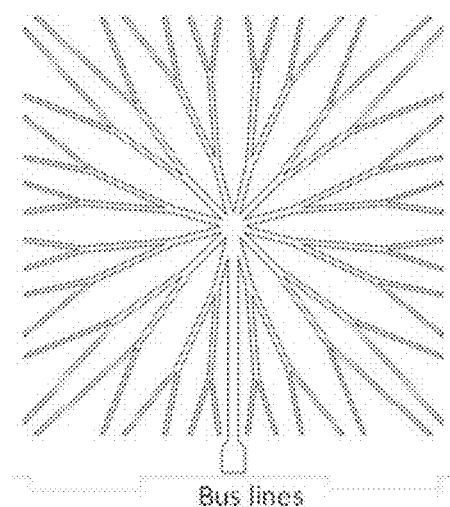
Figure 6:
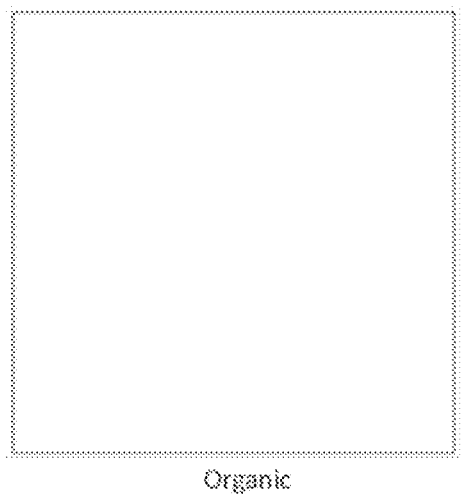
Figure 6:
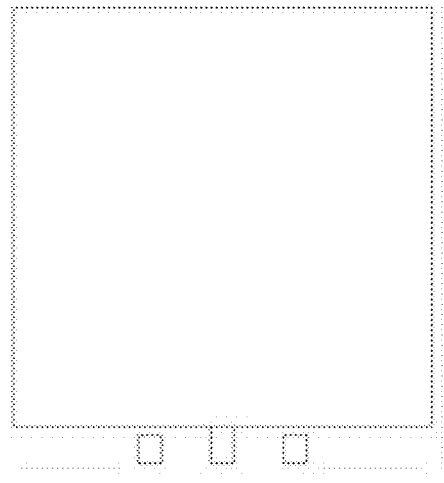
Figure 8:
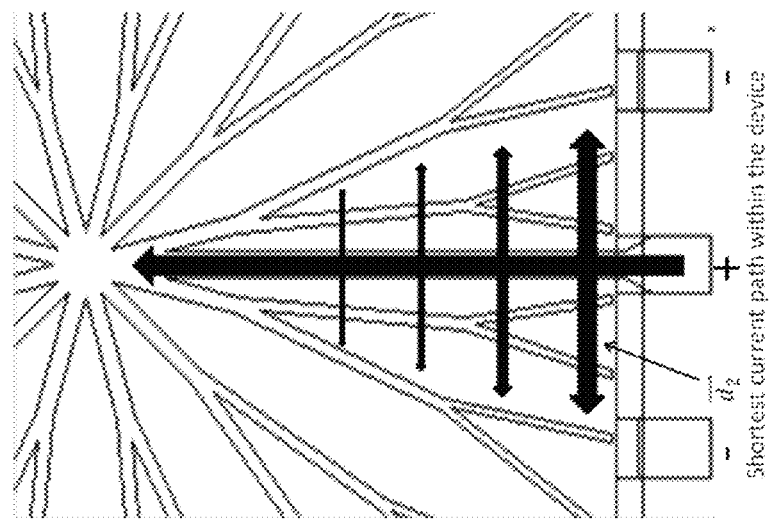
FIG. 8 shows an example of current flow in a conventional OLED panel as shown in FIG. 7.
Figure 7:
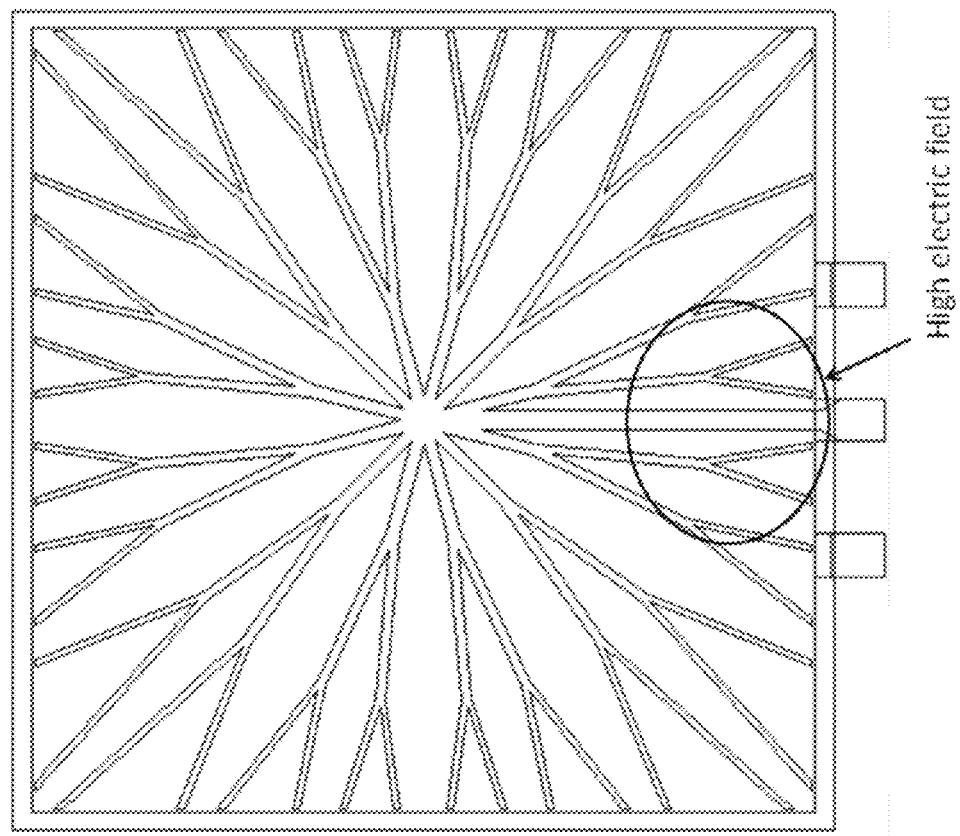
FIG. 7 shows an example layout of a conventional OLED panel based on the example masks of FIG. 6.

FIG. 5 shows a photograph of an OLED panel with conventional compact contact design. As can be seen in the image, there is a bright spot near the bottom center of the panel, close to the electrode contacts. This is expected due to the layout design of the panel. Example mask layouts corresponding to the panel in FIG. 5 are shown in FIG. 6, including an anode, bus lines, organic layer, and a cathode. The anode, organic, and cathode are all common masks. Contacts for both the anode and the cathode are placed along the bottom side of the panel, forming a compact contact arrangement. An example of a full layout of a panel that illustrates a region of high electric field is shown in FIG. 7. The corresponding current flow within the device is illustrated in FIG. 8, in which the arrows indicate the direction of current flow.

Because the anode is common under the bus lines in such a configuration, current will be delivered to the underlying anode along the center bus line bar starting from the electrode (anode) contact. Due to the short distance to the cathode contact, a high electric field is generated and the current is drawn towards the neighboring cathode contact. Therefore, the panel appears much brighter near the contact regions and forms a "hot spot" as shown in FIG. 5.

Figure 14:
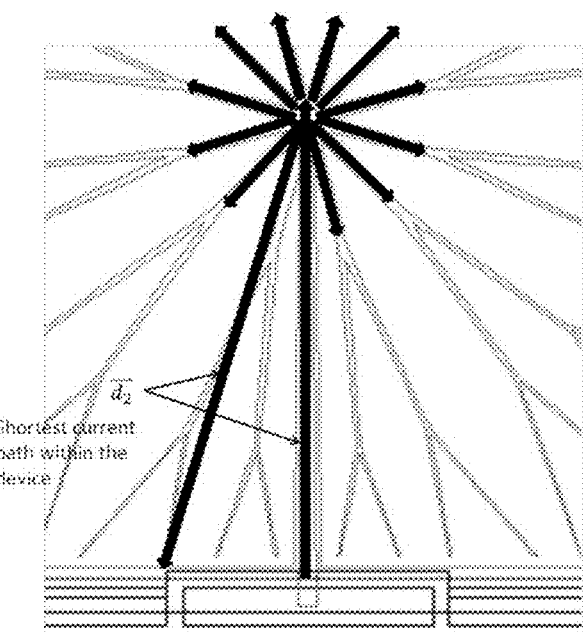
FIG. 14 shows an illustration of current flow in the OLED panel shown in FIG. 13.

Considering the active area to be a black box, the lateral virtual electric field within the active area contour may be plotted. The resulting shortest electric field line is marked in FIG. 9 as $\vec{d}_1$. Since only the lateral electric field distribution is considered, the shortest electric field line normally corresponds to the shortest distance between two electrode contacts (with some exceptions, as described herein). Meanwhile, the shortest lateral current path within the active area contour is illustrated in FIG. 14, as $\vec{d}_2$. Generally the vertical travel distance can be neglected, since it is typically 1 μm or less. Therefore, as shown, in a conventional arrangement, $|\vec{d}_1|=|\vec{d}_2|$.

Figure 10:
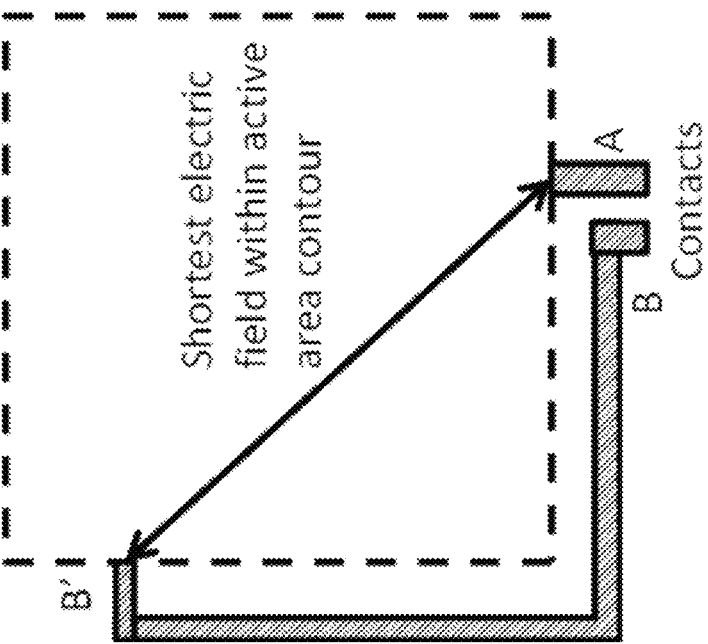
FIG. 10 shows an example of a compact design where the shortest electric field line does not correspond to contact distance according to an embodiment as disclosed herein.

Embodiments disclosed herein provide OLED arrangements having compact contact design, in which the shortest electric field line does not correspond to the contact distance. An OLED as disclosed herein may include a substrate, first and second electrical contacts, such as anode and cathode contacts, and an active region electrically connecting the electrical contacts. As used here, the active region refers to the electrically conducting materials and regions that are electrically disposed between the anode and the cathode of a device. The active region may include, for example, one or more organic layers as previously described, one or more insulators, or the like. A simplified OLED panel layout is shown in FIG. 10, in which the dashed lines represent the active area contour and the shadow regions are contacts and metal bus lines. As shown, although the two contacts A and B are arranged next to each other on the same edge of the device, the shortest electric field within the active area contour is not merely the distance between A and B. The actual entrance or exit of current through the active area is not between points A and B, but between A and B' instead. Therefore, within the active area contour, the shortest lateral electric field line is AB', which apparently is also the shortest current path within the device. This may vary from some embodiments disclosed herein, in which additional bus lines are disposed outside of the active area contour to assist current distribution.

Figure 9:
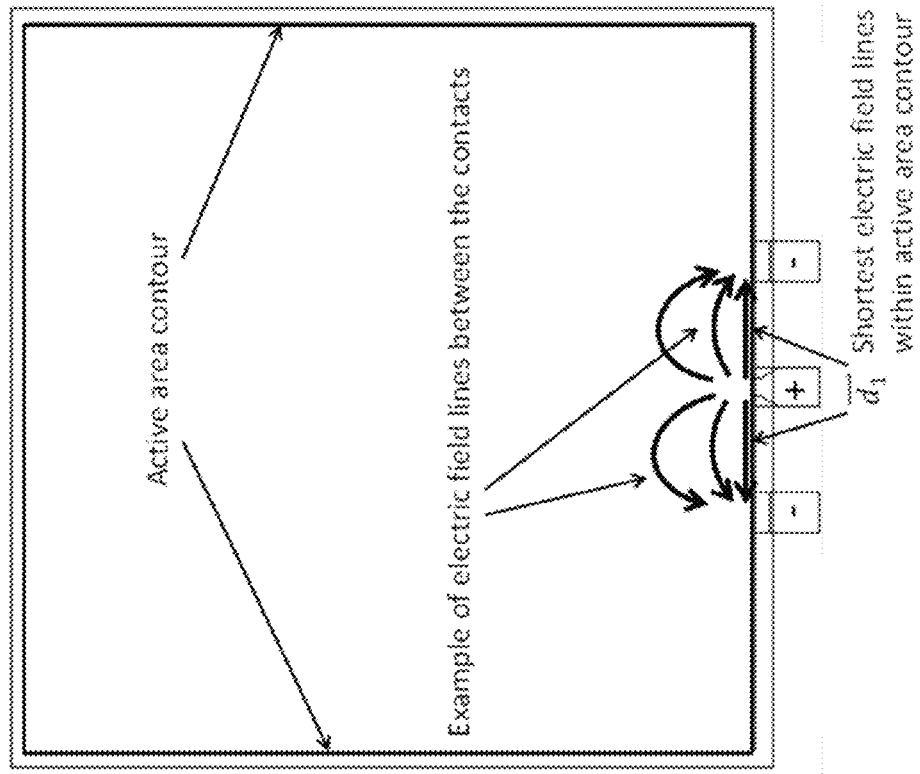
FIG. 9 shows a schematic representation of the shortest electric field line in a conventional OLED panel design.

In an embodiment, an OLED panel is provided in which the shortest lateral current path through the active region is longer than the shortest lateral electric field line within the active region, i.e., the shortest electric field line directly between the contacts. Preferably, the shortest lateral current path through the active region is at least 10% longer, 20% longer, 30% longer, or more, than the shortest lateral electric field within the active region. Preferably, the shortest lateral current path through the active region may be twice as long as the shortest lateral electric field within the active region. Alternatively or in addition, in some embodiments, the shortest lateral current path through the active region is at least as long as a shortest edge of the active region boundary, i.e., the shortest edge length of the active region contour, such as illustrated in FIGS. 9 and 15.

Figure 11:
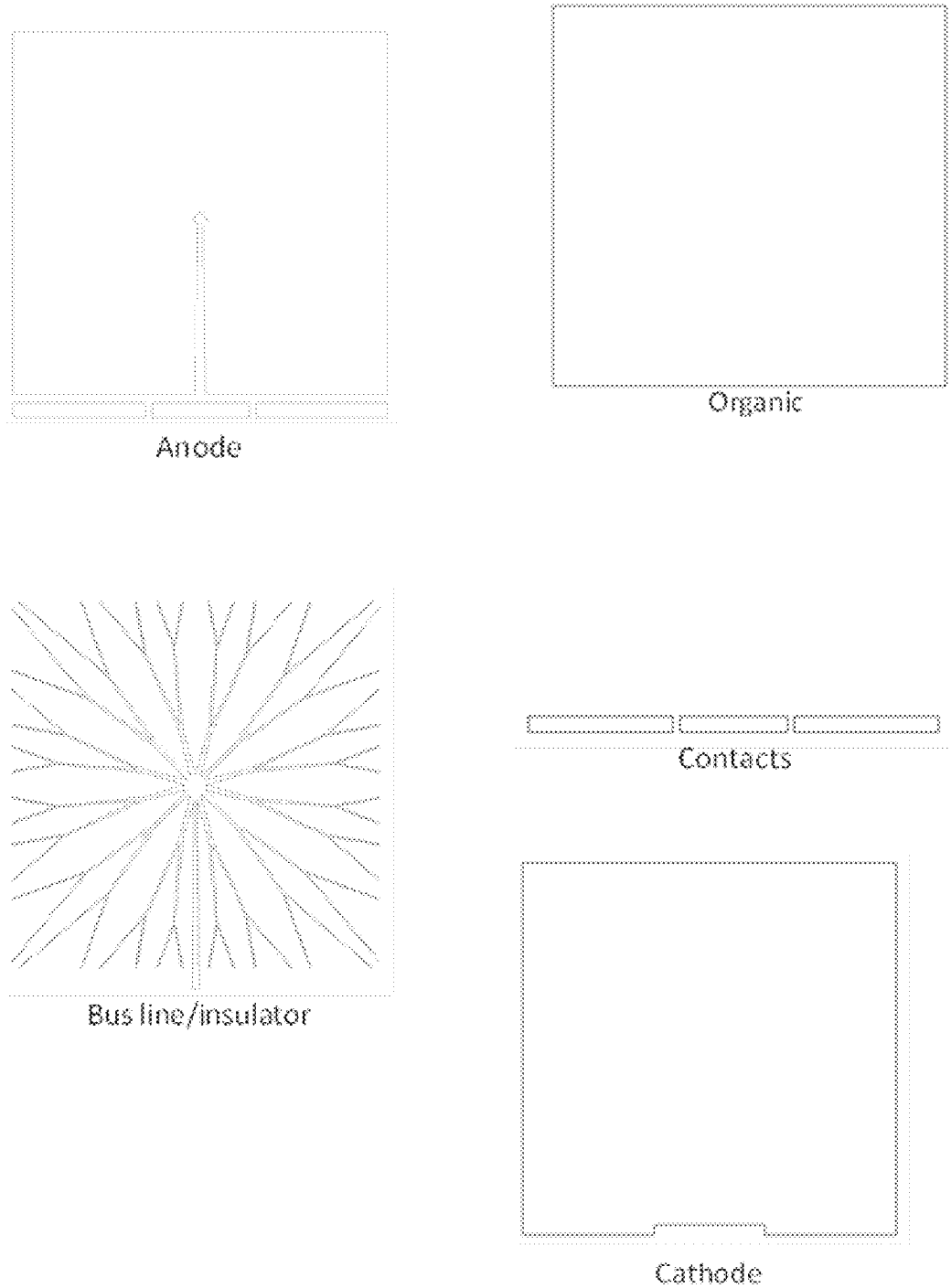
FIG. 11 shows example mask layouts of an OLED panel with patterned anode layout according to an embodiment as disclosed herein.

FIG. 11 shows an example arrangement of layers for such a device. The masks include an anode layout, a contacts layout, a bus line/insulator layout, an organic layer layout, and a cathode layout, as shown. Although the example layouts in FIG. 11 may not be shown precisely to scale, they are provided approximately at the same scale to provide an illustration of the approximate overlap of the layers in the completed device. The electrode contacts for the anode and cathode are still at bottom of the panel, forming a compact contact arrangement as previously described. The bus line layout is similar to the example illustrated in FIG. 6, with a thinner shape which has relatively little to no impact on the uniformity of the device. The bus line mask also may be used to deposit a self-aligned insulator. The major difference of the design illustrated in FIG. 11 from a conventional design lies primarily in the anode pattern. In the design of FIG. 11, the anode is no longer a common layout. Instead, the anode is patterned into a shape such that the central bus line bar fills the central void region.

Figure 12:
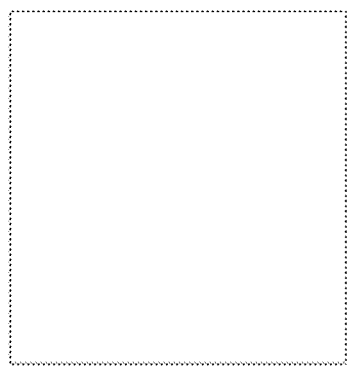
FIG. 12 shows a cutting pattern of an example OLED panel according to an embodiment as disclosed herein.
Figure 13:
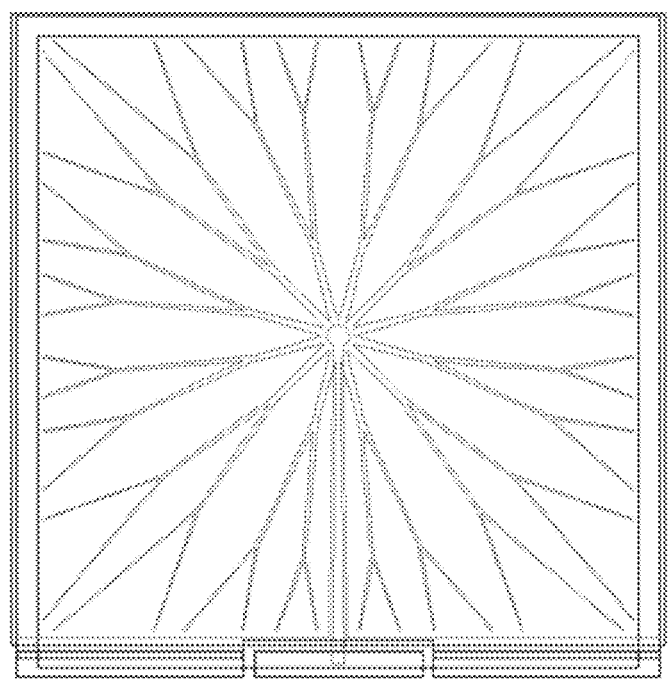
FIG. 13 shows an example of a complete layout of an OLED panel according to an embodiment as disclosed herein.

A cutting pattern also may be used to reduce the non-active areas so as to form an edgeless appearance. An example cutting pattern according to an embodiment is shown in FIG. 12, and an example of a resulting complete layout of the panel including the layers shown in FIG. 11 and the cutting pattern is shown in FIG. 13. FIG. 14 shows a magnified view of the bottom contact region of the complete layout of FIG. 13, in which the black arrows represent the directions of current flow. As shown in FIG. 14, because the anode does not electrically connect to the bus lines near the contact region, but rather connects in about the middle of the panel, the current is forced to travel from the bottom of the panel (near the anode contact) to the center before entering the anode layer. Since the center is farther from the cathode contact, the concentrated electric field may be reduced and the "hot spot" present in the example conventional OLED panel may be eliminated. More generally, in some embodiments the device may include a bus line disposed within the active region that is electrically connected to one of the electrodes. The bus line may extend into an internal region of the active region, such as the central portion shown in FIG. 14. The bus line may include various extensions or branches, such as multiple radial lines that extend outward toward edges of the active region from a common central point. An example of such a configuration is shown in FIG. 14.

The improvement in emission uniformity can be explained by a comparison of the lateral electric filed line and the current path in the panel. The virtual lateral electric field within the active area is shown in FIG. 15, in which the shortest electric field line $\vec{d}_1$ is shown. However, the shortest lateral current path within the active area contour, $\vec{d}_2$, shown in FIG. 14, is much longer than $\vec{d}_1$. Therefore, in this design and others according to embodiments disclosed herein, $|\vec{d}_1| < |\vec{d}_2|$. It is this difference in current path that allows the improved emission uniformity to be achieved.

FIG. 16 shows a cross-section of a device structure near the anode contact region of a conventional OLED panel having a common anode layout, compared side-by-side with an OLED panel as disclosed herein that includes a patterned anode layout. The entrance of the current into the anode is closer to the anode contact in the conventional design than that in the design patterned. The current travel distance is deliberately increased in the patterned anode design, as disclosed herein. However, because the bus line typically is a highly conductive metal, there is little or no resistive loss due to the longer path. Thus, as disclosed herein, the current path can be greatly increased relative to a conventional design with little or no substantive effect on the operation or efficiency of the panel. To further reduce the potential effects of the bus line, it may be preferred that the bus line includes or is made entirely from one or more materials having a resistivity of not more than $10^{-6}$ Ωm.

Figure 17A:
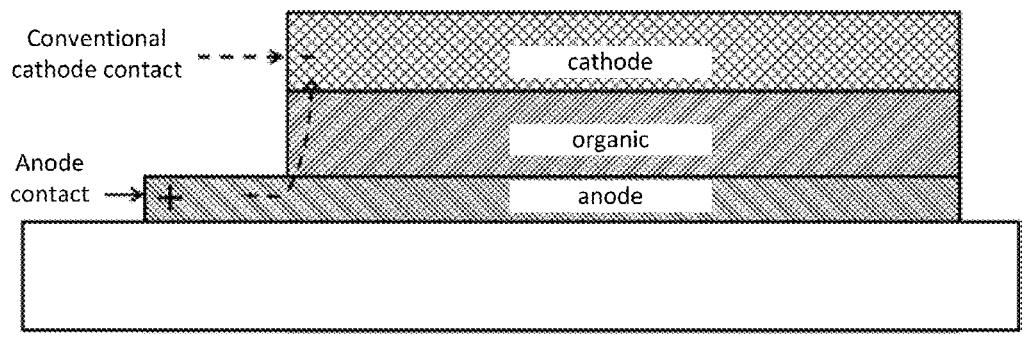
FIGS. 17A and 17B show comparisons of a conventional device and a device having a via according to an embodiment as disclosed herein.
Figure 17B:
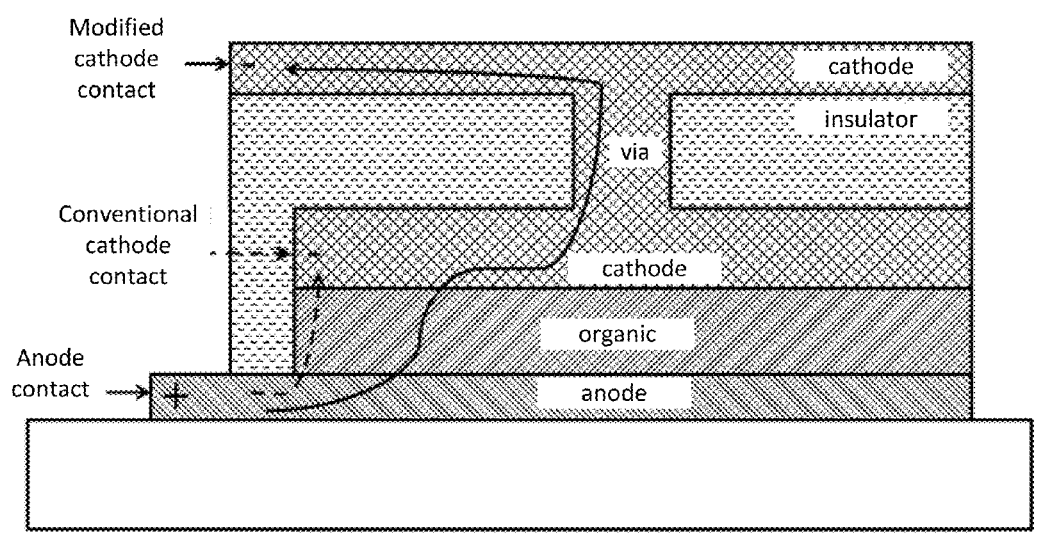

In some embodiments, other techniques may be used to improve the uniformity of an OLED panel having a compact contact arrangement. For example, one or more vias may be introduced to intentionally increase the current travel distance in the panel. FIG. 17A shows a current flow path in a conventional OLED design as previously described. FIG. 17B shows a current flow path in an embodiment in which a via is provided between portions of the cathode. In the conventional design of FIG. 17A, the anode and cathode contacts are very close to each other, which, as may introduce a localized high electric field as previously described. The shortest current path is shown by the dashed arrow in FIG. 17A.

In contrast, in the embodiment shown in FIG. 17B, one or more via holes may be formed by disposing an insulator layer that partially exposes the cathode. An extra layer of metal is then disposed on top of the insulator, connecting cathode to cathode contact. In this case, the current flow path is elongated, as shown by the solid arrow in FIG. 17B. The conventional current path is also shown in FIG. 17B for reference. If the cathode material and the top metal layer are highly conductive, there is no additional voltage drop due to the excess current travel distance. In fact, this is typically true in a bottom emission OLED device where highly conductive aluminum is used as cathode. Via holes also may be formed at the anode layer, and/or any other layer that is necessary.

Although examples and embodiments disclosed herein provide a patterned anode by way of example and illustration, it will be readily understood by one of skill in the art that in some embodiments the anode may be a common electrode, and a patterned cathode may be used.

In general, OLED panels and other devices disclosed herein may have the physical attributes and characteristics for which OLED panels are desired, regardless of the presence of a longer shortest current path as disclosed herein. For example, OLEDs according to various embodiments may be flexible and/or transparent. Similarly, any suitable substrate may be used, including flexible materials, plastics, glass, and/or metal foils. Generally, the configurations disclosed herein may have little or no effect on the appearance or physical characteristics of an OLED, other than those specifically described.

As previously described, a self-aligned insulator may be used in various configurations disclosed herein. In an embodiment, a simplified method to fabricate the self-aligned insulator for large-area OLED lighting panels may be used. Metal bus lines are commonly used in large-area OLED lighting panels to improve current distribution and hence to improve emission uniformity. Such bus lines often are preferred to be covered by an insulator layer so as to prevent electrical shorting. Conventionally, metal bus lines and insulator layer are fabricated using lift off process through photolithography step. Alternatively, metal bus lines and insulator layer may be fabricated through shadow masks using vacuum thermal evaporation (VTE). Detailed descriptions of example fabrication processes for metal bus lines can be found in U.S. Pat. No. 8,432,095 and U.S. Patent Publication No. 2012/0286650, the disclosure of each of which is incorporated by reference in its entirety.

However, in both lithography and VTE patterning techniques, bus lines and insulator layers typically require different masks. In the lithography approach, metal bus lines formed from a lift off process usually have sharp and/or rough edges. As a result, an insulator layout is required to have a larger footprint than the bus line layout to prevent the sharp metal edges from penetrating through the organic layer. Moreover, metal lift off processes often require a negative photoresist, while insulator patterning techniques typically use a positive photoresist. As a result, the mask layouts for the bus lines and the insulator typically be reversed tones. This can cause complexity in making the two masks the same in a lithography patterning system. The coverage of insulator over bus lines on each side in a lithography system often may be in the tens of microns level.

In VTE patterning techniques, it is commonly believed that the bus lines need to be well enclosed, so the insulator often is also designed to be broader than the bus lines so as to completely cover the bus lines, for example as described in U.S. Patent Publication No. 2012/0286650. Therefore, the shadow mask for the insulator is again different than that of bus lines. In view of the misalignment tolerance and shadowing effect of a VTE system, the coverage of the insulator over the bus lines on each side often may vary from hundreds of microns to several millimeters, significantly reducing the fill factor of the device. Typically, the use of additional masks also increases the chances for particles and defects to be introduced to the device, subsequently reducing the lifetime of the device. Therefore, it is beneficial to minimize the overhang between insulator and bus lines as well as to reduce the number of shadow masks to be used.

Figure 18A:
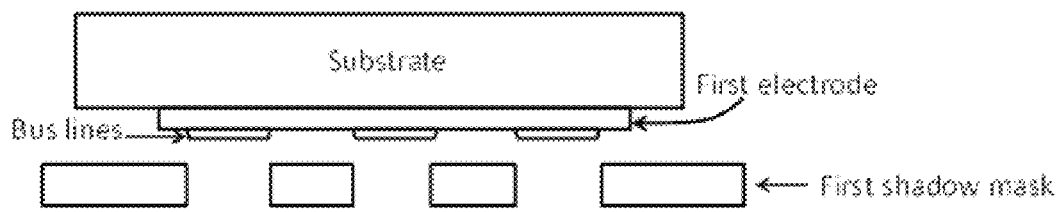
FIGS. 18A and 18B show an example process to fabricate bus lines and an insulator through a single shadow mask according to an embodiment disclosed herein.
Figure 18B:
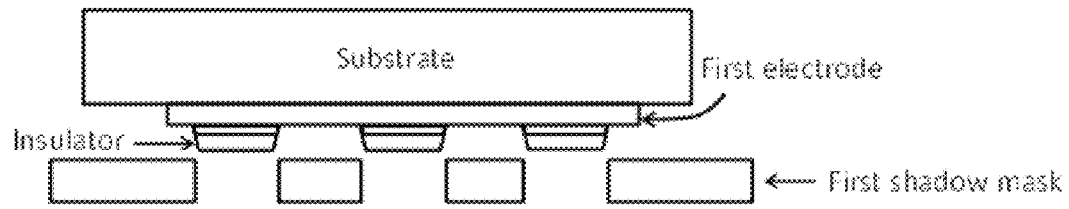

In an embodiment, bus lines and an insulator layer may be fabricated consecutively through the same shadow mask. FIGS. 18A-B illustrate an example process for doing so. In FIG. 18A, a first shadow mask is used to dispose metal bus lines over the first electrode. In FIG. 18B, the same first shadow mask is used to dispose the insulator over the bus lines. Notably, there is no mask shift or repositioning of either mask or substrate required between the two processes, so the relative position between the mask and substrate is substantially the same during the two steps. The process may be followed by disposing one or more organic layers and the second electrode.

Figure 19A:
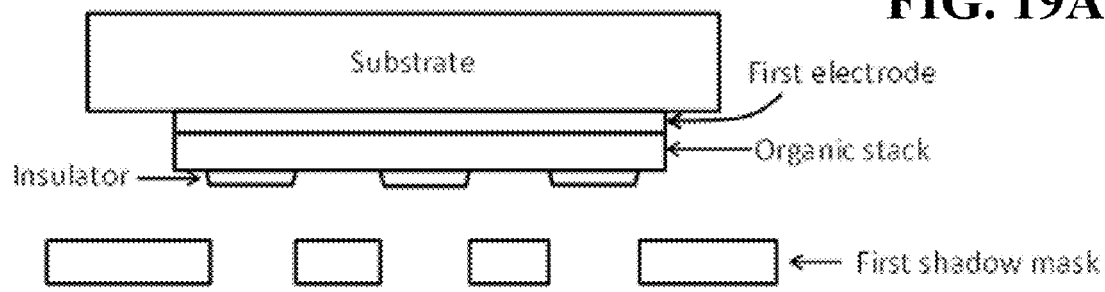
FIGS. 19A and 19B show an example process to fabricate bus lines and an insulator through a single shadow mask according to an embodiment disclosed herein.
Figure 19B:
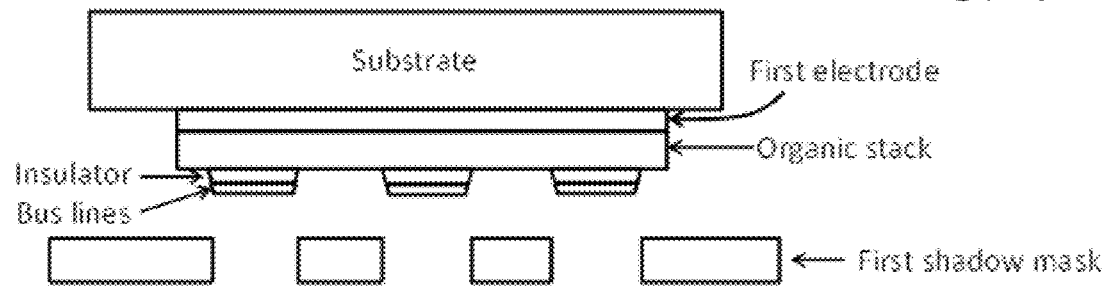

FIGS. 19A-B show another example process similar to that described with respect to FIGS. 18A-B. In an embodiment, the first electrode and the organic layer may be disposed in previous steps. As shown in FIG. 19A, the insulator may be disposed through the first shadow mask. In FIG. 19B, the bus lines may be disposed through the same first shadow mask. Again, the relative position between the mask and substrate remain substantially the same between the two. The process may then be followed by disposing the second electrode on the device.

Figure 20:
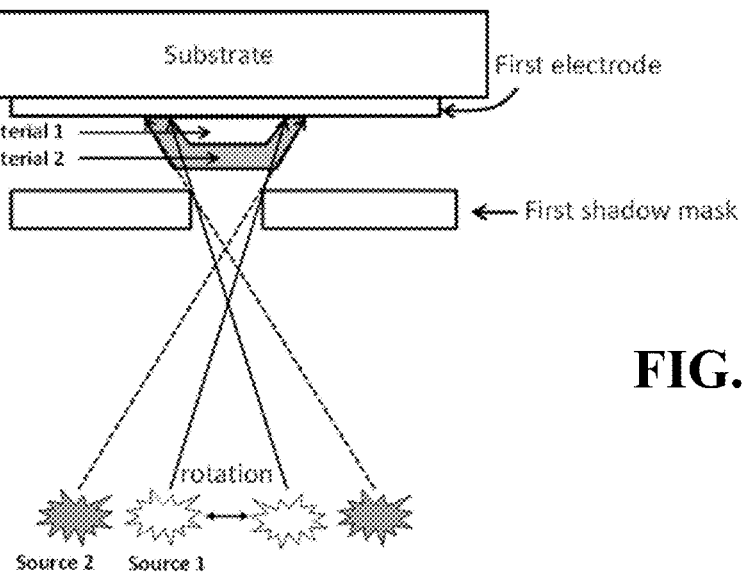
FIG. 20 shows an example of the relationship between a source position and a resulting film profile according to embodiments disclosed herein.

In an embodiment, the profile of the deposited film may be controlled through the position of the material source, the gap between the substrate and the mask, and the material property of the deposited material. In order to ensure the coverage of the insulator over bus lines, the source positions of the two materials may be arranged such that the more shadowing effect occurs during insulator deposition rather than during bus line deposition. An example is illustrated in FIG. 20. In the example arrangements shown, Source 1 is positioned closer to the center of the substrate, so that the shadowing effect of material 1 is less. In contrast, Source 2 is placed farther away from the center and thus Material 2 spreads more than Material 1 when deposited on the substrate. In an embodiment, material 1 may provide conductive bus lines, and material 2 may be the insulator. Detailed description of the relationship of film profile and deposition condition may be found in U.S. Pat. No. 8,432,095.

EXPERIMENTAL

Figure 21:
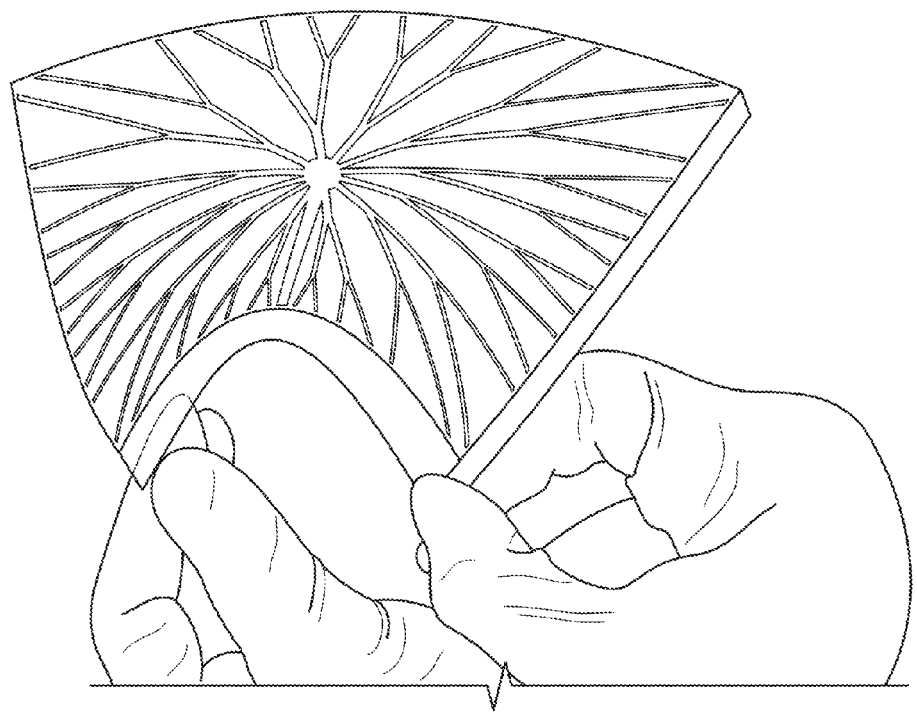
FIG. 21 is a photograph of an edgeless OLED panel with a single-side contact layout according to an embodiment disclosed herein.

An OLED panel was fabricated using a mask set as shown in FIGS. 11-13, on 125 µm planarized PEN plastic. An anode was sputtered onto the plastic substrate through an anode mask, followed by 500 Å Al deposited through the contact mask. Bus line mask was used for disposing 800 Å Al and 2000 Å LiF consecutively. LiF is used as an insulating material here, but any other insulating material that can be evaporated may be used as well. Organic layers were deposited through organic mask, including HIL, HTL, green EML, BL, ETL, and EIL. The detail device structure is not important in this application. A semi-transparent cathode was deposited through cathode mask. Finally, an insulating layer was deposited as a capping layer through the organic mask. Both capping layer and contact layer may be optional, depending on the device structure and panel layout. After the fabrication of OLED, the panel was cut to reduce the bezel area. The device was then encapsulated with 2 µm thin-film barrier followed by a 4 µm spin-on polymer layer. Photograph of the complete panel being bent is shown in FIG. 21, where no shorting was observed on bus lines.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. An organic light emitting device comprising:
a substrate;
an anode contact;
a cathode contact; and
a pixel;
wherein the pixel comprises:
an anode;
a cathode; and
an active region disposed between the anode and the cathode;
wherein within the active region, the shortest lateral current path is longer than the shortest lateral electric field line drawn between a point where the anode contact is in physical contact with the anode and a point where the cathode contact is in physical contact with the cathode.

2. The device of claim 1, wherein the shortest lateral current path is at least 10% longer than the shortest lateral electric field within the active region.

3. The device of claim 1, wherein the shortest lateral current path through the active region is at least twice as long as the shortest lateral electric field within the active region.

4. The device of claim 1, wherein the shortest lateral current path through the active region is at least as long as a shortest edge of the active region.

5. The device of claim 1, further comprising a bus line disposed within the active region and electrically connected to the first electrical anode contact or the cathode contact.

6. The device of claim 5, wherein the bus line extends into an internal region of the active region.

7. The device of claim 6, wherein the bus line comprises a plurality of radial lines extending from a common point toward edges of the active region.

8. The device of claim 5, wherein the bus line comprises a material having a resistivity of not more than $10^{-6}$ Ωm.

9. The device of claim 1, wherein the substrate is flexible.

10. The device of claim 1, wherein the substrate is transparent.

11. The device of claim 1, wherein the device has a bezel of not more than 3 mm.

12. The device of claim 1, wherein the substrate comprises a plastic material.

13. The device of claim 12, wherein the substrate comprises a material selected from the group consisting of: polyethylene, polypropylene (PP), polystyrene (PS), poly ethylene terephthalate (PET), polyethersulfone (PES), polyethylene naphthalate (PEN), and polyimide.

14. The device of claim 1, wherein the substrate comprises a glass.

15. The device of claim 1, further comprising:
a first electrode electrically connected to the first electrical contact;
a second electrode electrically connected to the second electrical contact;
an organic emissive layer disposed between the first electrode anode and the second electrode cathode and in the active region;
a conductive layer; and
an insulating layer.

16. The device of claim 15, wherein the conductive layer and the insulator layer are disposed between the first electrode anode and the organic emissive layer or between the cathode and the organic emissive layer.

17. The device of claim 5, further comprising an insulator layer disposed adjacent to the bus line.

* * * * *